United States Patent
Honmou

[11] Patent Number: 6,019,523
[45] Date of Patent: Feb. 1, 2000

[54] OPTICAL SEMICONDUCTOR MODULE AND METHOD FOR MANUFACTURING SAME

[75] Inventor: Hiroshi Honmou, Tokyo, Japan

[73] Assignee: NEC Corporation, Japan

[21] Appl. No.: 09/107,745

[22] Filed: Jun. 30, 1998

[30] Foreign Application Priority Data

Jul. 3, 1997 [JP] Japan .................................. 9-177935

[51] Int. Cl.[7] .................................................. G02B 6/36
[52] U.S. Cl. .............................................. 385/94; 385/88
[58] Field of Search ................................ 385/88–94, 15, 385/14, 1–9

[56] References Cited

U.S. PATENT DOCUMENTS 5,852,696  12/1998  Collins et al. ............................. 385/88
5,940,550  8/1999  Plickert et al. ....................... 385/88 X

FOREIGN PATENT DOCUMENTS 7-288332  10/1995  Japan .

OTHER PUBLICATIONS

T. Ishii, et al., "Pigtail Type Optical Module by Transfer Molding", 1997 IEICE General Conference, C–3–62.

*Primary Examiner*—Phan T. H. Palmer

[57] ABSTRACT

It is an object of the invention to provide a optical semiconductor module, which is resisting against external noise and can be easily fabricated. The optical semiconductor module comprises an optical wave-guiding medium allocated on a substrate, a photosensor for optical to electrical converting the optical signal emitted from an output end of the optical wave-guiding medium, means for optically coupling the output end of the optical wave-guiding medium with a light-receiving surface of the photosensor, insulating resin for filling space surrounding an output part of the optical wave-guiding medium and the photosensor, and conductive resin, which is applied to the insulating resin and communicates with a ground plane connected with a ground terminal of the photo sensor. Insulting resin is composed of the first resin, which has a refractive index being the same as that of core of the optical wave-guiding medium, and fills a space between the output end of the wave-guiding medium and the light receiving surface of the photosensor, and the second resign, which is sealing resin for enclosing the first resin. Means for optically coupling is constituted of a mirror, which directs a light emitted from the optical wave-guiding medium to the photosensor.

7 Claims, 1 Drawing Sheet

OPTICAL SEMICONDUCTOR MODULE AND METHOD FOR MANUFACTURING SAME

FIELD OF THE INVENTION

The invention relates to an optical semiconductor module, which optically couples an optical wave-guiding medium, such as an optical fiber, with a optical semiconductor device, such as a semiconductor laser and a photodiode, and a method for manufacturing the same.

BACKGROUND OF THE INVENTION

An optical semiconductor module, which optically couples an optical wave-guiding medium, such as an optical fiber, with an optical semiconductor device, such as a photodiode or a semiconductor laser, is one of the most important devices for constructing an optical communication system. In recent years, a resin sealed optical semiconductor module, which simplifies the process of package, attracts attentions of opt-electronic engineers from a view point of reduction in price.

For example, an optical semiconductor module of this kind was reported on Proceeding of the 1997 IEICE general conference, C-3-62. This optical semiconductor module is composed of a semiconductor laser diode (LD) and a photodiode (PD), and enclosed by transparent resin, and circumference thereof is molded by insulating resin.

In general, since resin is low-priced as packing material, the cost of the optical semiconductor module can be reduced. However, since resin for sealing the optical semiconductor module serves as an insulator for preventing short circuit between the structural elements, electrical noise from the outside is contained in the optical semiconductor module and affects the optical devices in the module. Especially, in case that a signal voltage received by the photodiode is weak, a satisfactory receiving sensitivity cannot be achieved on account of noise contained in the module.

As means for solving this problem, the optical semiconductor module, in which the surface of insulating resin is covered with metallic shielding pieces or a metallic shielding layer, is proposed. The optical semiconductor module of this kind is disclosed in Japanese Patent Kokai 7-288332.

According to the optical semiconductor module, in which the source of insulating resin is covered with the metallic shielding pieces or the metallic shielding layer, it is necessary to form insulating resin into a box-like configuration, which is easily covered with the metallic shielding layer or etc. However, the process for forming insulating resin into the box-like configuration requires much labor, which makes it difficult to reduce the cost of the optical semiconductor module. Moreover, there arises a problem that a particular process is necessary for forming the metallic shielding layer.

SUMMARY OF THE INVENTION

Accordingly, it is an object of the invention to provide an optical semiconductor module, which is resisting against external noise and can be fabricated at a low price.

It is an further object of the invention to provide a method for fabricating an optical semiconductor model, which is resisting against external noise and can be fabricated at a low price.

According to the first feature of the invention, an optical semiconductor module comprises:

an optical wave-guiding medium allocated on a substrate for transmitting an optical signal, a photosensor for optical to electrical converting the optical signal emitted from an output end of the optical wave-guiding medium, means for optically coupling the output end of the optical wave-guiding medium with a light-receiving surface of the photosensor, insulating resin for filling a space surrounding an output part of the optical wave-guiding medium and the photosensor, and conductive resin, which is applied to an outer surface of the insulating resin and communicates with a ground plane connected with a ground terminal of the photosensor.

According to the second feature of the invention, a method for fabricating an optical semiconductor module comprises the steps of:

optically coupling an output end of the optical wave-guiding medium with a light-receiving surface of the photosensor, filling a space surrounding an output part of the optical wave-guiding medium and the photosensor with insulating resin, and applying conductive resin to a surface of the insulating resin so that a surface of the insulating resin is covered with the conducting resin and the conductive resin communicates with a ground plane connected with a ground terminal of the photosensor.

BRIEF DESCRIPTION OF THE DRAWINGS

The invention will be explained in more detail in conjunction with the appended drawing, wherein.

DESCRIPTION OF THE PREFERRED EMBODIMENTS

Figure 1:
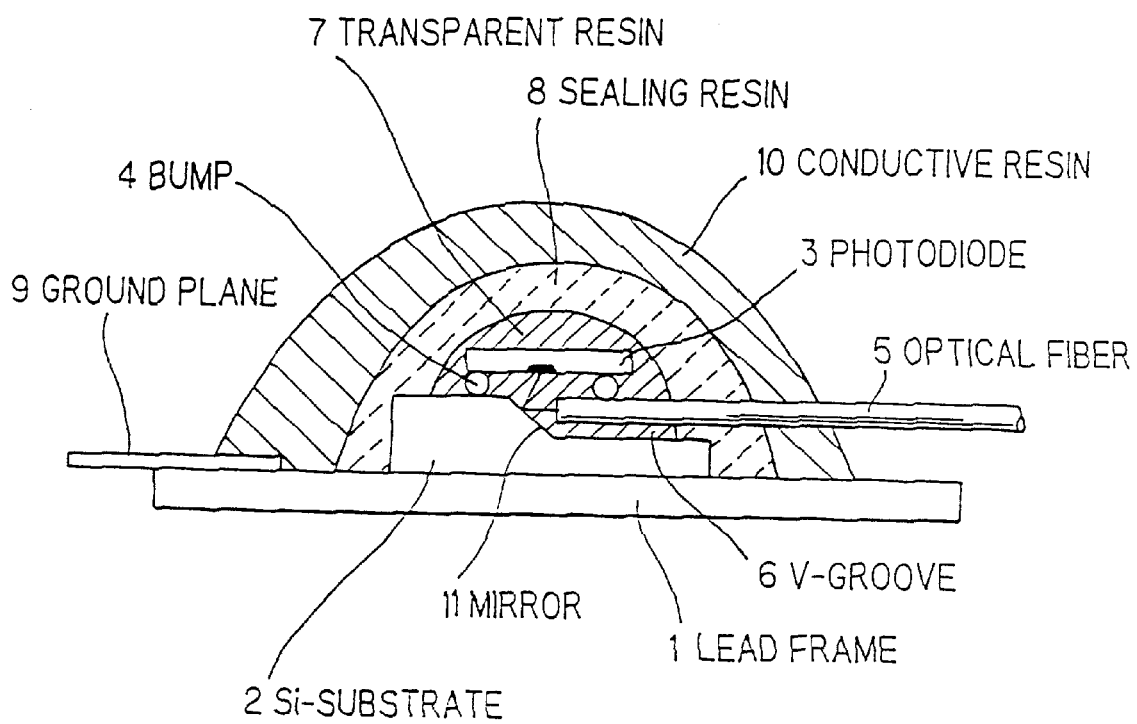
FIG. 1 shows a preferred embodiment of the invention.

Next, a preferred embodiment of the invention will be explained referring to an appended drawing.

FIG. 1 shows an outline of the preferred embodiment of the invention. As shown in FIG. 1, a PD 3 of surface incidence type is combined with A Si substrate 2, which is mounted on a lead frame 1, via bumps 4. An optical fiber 5 is fitted in a V-groove 6, and resin 7 with high optical transmissivity is filled around an optical path of the optical fiber 5. All the structural elements are molded by resin 8 with high sealing capability, and an optical semiconductor module is obtained in this way. Refractive index of transparent resin 7 is approximately the same as that of the core of the optical fiber 5, and resin 8 encloses the structural elements of the optical semiconductor module to form an airtight sealing.

Both transparent resin 7 and sealing resin 8 serve as insulators for preventing short circuits between the structural elements of the optical semiconductor module. Moreover, conductive resin 10 covers sealing resin 8 and a ground plane 9, which is connected with the lead frame 1. In the aforementioned structure, a weak optical signal emitted from the optical fiber 5 is reflected by a mirror 11 and directed to the DP 3, and the optical signal incident on the PD 3 is converted into a weak electrical signal. It should be noted that the ground terminal of the PD 3 is connected with the lead frame 1, though it is not explicitly shown in FIG. 1.

Since the optical semiconductor module is covered with conductive resin 10, an electrical noise from the outside of the optical semiconductor module flows to the ground plane 9 via conductive resin 10, and does not affect the weak electrical signal. Accordingly, high receiving sensitivity can be achieved. Moreover, since conductive resin 10 serving as shielding material is liquid in case that it is applied to a half-finished optical semiconductor module, it uniformly covers an outer surface of the module, even when surfaces of transparent resin 7 and sealing resin 8 are uncertain.

Accordingly, there is no necessity for forming insulating resin into a box-like configuration with a particular shape, a manufacturing process related thereto can be cut down, and cost of products can be reduced. In the steps of covering the half-finished optical semiconductor module with resin layers, no particular process is necessary, and resin can be easily applied thereto by a commonly used potting process.

Next, the embodiment of the invention will be concretely explained referring to FIG. 1.

In the structure shown in FIG. 1, the PD 3 is provided with a light receiving surface with a diameter of 80 $\mu$m. The optical fiber 5 is a multimode fiber with a core diameter of 62.5 $\mu$m and an outer diameter of 125 $\mu$m. A refractive index of the transparent resin 7 is 1.47, which is nearly the same as that of the core of the optical fiber 5, and transmissivity of transparent resin 7 is more than 95%.

Sealing resin 8 is formed on transparent resin 7. The bump 4 is formed of AuSn solder with a diameter of 90 $\mu$m and a height of 50 $\mu$m. Conductive resin 10 is silicone based resin containing Ag filler, and its specific resistance is $3 \times 10^{-4}$ $\Omega$cm. Conductive resin 10 is applied o the surface of sealing resin 8 by means of a commonly used dispenser, heated at 150° C. for three minutes and hardened. Although, the shape of sealing resin 8 is a semicircle, sealing resin 8 can be easily covered with liquid conductive resin 10.

In the aforementioned structure, the weak optical signal emitted from the optical fiber is reflected by the mirror 11, and the optical signal incident on the PD 3 is converted into the weak electrical signal. Since the surface of the optical module is formed of conductive resin 10, electrical noise flows to the ground plane 9 via conductive resin 10 and does not affect the weak electrical signal received by the PD 3. In this way, a high receiving sensitivity of the optical semiconductor module can be achieved.

In the embodiment shown in FIG. 1, although transparent resin 7 and sealing resin 8, both serving as insulating layers, constitute a double layered structure, the constitution of the insulator layers is never restricted to the double layered structure, and a single layered structure or more than three layered structure can be adopted, so long as a satisfactory optical coupling characteristic and reliable sealing property can be achieved. Moreover, another insulating resin may be further formed on conductive resin 10 from a viewpoint of reliability and maintenance. In this embodiment, conductive resin 10 is formed on sealing resin 8, but a similar effect can be obtained in case that conductive resin 10 is formed on transparent resin 7 also.

Although the optical fiber is employed as an optical wave-guiding medium in this embodiment, a $SiO_2$ optical waveguide, a polyimide optical waveguide and a plastic optical waveguide can be adopted instead of the optical fiber. The optical fiber is never restricted to the multimode optical fiber, and a single mode optical fiber can be adopted as the optical wave-guiding medium. Moreover, the PD of surface incidence type is used in the embodiment, but an avalanche photodiode (APD), a semiconductor laser diode (LD) and an optical amplifier can be adopted instead of the PD. The PD is combined with the Si substrate via the bumps, but the PD can be combined with the Si substrate via a flat solder layer without using the bumps.

As mentioned in the above, according to the optical semiconductor module according to the invention, electrical noise form the outside of the optical semiconductor module flows to the ground plane via conductive resin, and cannot get into the PD. Accordingly, external noise is shielded by conductive resin and does not affect the characteristic of the PD, which generates a weak output signal. Moreover, there is no necessity for forming resin into a box-like configuration with a particular shape, the process related thereto can be cut down. Furthermore, the process of covering the optical semiconductor module with conductive resin requires no particular technology, and a commonly used potting process can be easily applied thereto. Accordingly, the optical semiconductor module can be supplied at a low price.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is that:

1. An optical semiconductor module comprising:

an optical wave-guiding medium allocated on a substrate for transmitting an optical signal, a photosensor for optical to electrical converting said optical signal emitted from an output end of said optical wave-guiding medium, means for optically coupling said output end of said optical wave-guiding medium with a light-receiving surface of said photosensor, insulating resin for filling a space surrounding an output part of said optical wave-guiding medium and said photosensor, and conductive resin, which is applied to an outer surface of said insulating resin and communicates with a ground plane connected with a ground terminal of said photosensor.

2. An optical semiconductor module according to claim 1, wherein:

said insulating resin is compose of transparent resin, which has a refractive index being nearly a same as that of core of said optical wave-guiding medium, and fills a space neighboring said output part of said optical wave-guiding medium and said photosensor, and sealing resin for enclosing said transparent resin.

3. An optical semiconductor module according to claim 1, wherein:

said optical wave-guiding medium is an optical fiber.

4. An optical semiconductor module according to claim 1, wherein:

said optical wave-guiding medium is an optical waveguide.

5. An optical semiconductor module according to claim 1, wherein:

said mean for optically coupling is constituted of a light-reflecting means for directing a light emitted from said output end of said optical wave-guiding medium to said light-receiving surface of said photosensor.

6. A method for fabricating an optical semiconductor module, which comprises an optical wave-guiding medium for transmitting an optical signal and a photosensor for optical to electrical converting said optical signal, comprising the steps of:

optically coupling an output end of said optical wave-guiding medium with a light-receiving surface of said photosensor, filling a space surrounding an output part of said optical wave-guiding medium and said photosensor with insulating resin, and applying conductive resin to a surface of said insulating resin so that a surface of said insulating resin is covered with said conducting resin and said conductive resin communicates with a ground plane connected with a ground terminal of said photosensor.

7. A method for fabricating an optical semiconductor module according to claim 6, wherein:

said step of filling said space comprises the steps of:

filling an inner space neighboring said photosensor and an output part of said optical wave-guiding medium with a transparent resin, refractive index of which is nearly same as that of a core of said optical wave-guiding medium, and covering an outer surface of said inner space with sealing resin.

\* \* \* \* \*